(12) United States Patent
Cao

(10) Patent No.: US 8,569,785 B2
(45) Date of Patent: *Oct. 29, 2013

(54) SEMICONDUCTOR LIGHT SOURCE FOR ILLUMINATING A PHYSICAL SPACE INCLUDING A 3-DIMENSIONAL LEAD FRAME

(75) Inventor: Densen Cao, Sandy, UT (US)

(73) Assignee: CAO Group, Inc., West Jordan, UT (US)

( * ) Notice: Subject to any disclaimer, the term of this patent is extended or adjusted under 35 U.S.C. 154(b) by 573 days.

This patent is subject to a terminal disclaimer.

(21) Appl. No.: 12/296,274

(22) PCT Filed: Apr. 4, 2007

(86) PCT No.: PCT/US2007/065995
§ 371 (c)(1),
(2), (4) Date: Oct. 6, 2008

(87) PCT Pub. No.: WO2007/115322
PCT Pub. Date: Oct. 11, 2007

(65) Prior Publication Data
US 2010/0096643 A1    Apr. 22, 2010

Related U.S. Application Data

(63) Continuation-in-part of application No. 11/393,323, filed on Apr. 4, 2006, now Pat. No. 7,728,345, which is a continuation-in-part of application No. 10/773,123, filed on Feb. 5, 2004, now abandoned, which is a continuation-in-part of application No. 09/938,875, filed on Aug. 24, 2001, now Pat. No. 6,746,885.

(51) Int. Cl.
*H01L 33/00* (2010.01)

(52) U.S. Cl.
USPC ........ 257/99; 257/88; 257/E33.062; 362/230; 362/249.06; 362/547

(58) Field of Classification Search
USPC ...................................... 257/88, 99
See application file for complete search history.

(56) References Cited

U.S. PATENT DOCUMENTS

| | | |
|---|---|---|
| 1,151,377 A | 8/1915 | Nash |
| 4,240,090 A | 12/1980 | Hughes |
| 4,394,679 A | 7/1983 | Hawrylo |
| 4,674,011 A | 6/1987 | Patton |
| 4,675,575 A | 6/1987 | Smith |
| 4,727,289 A | 2/1988 | Uchida |
| 5,055,892 A | 10/1991 | Gardner |
| 5,160,200 A | 11/1992 | Cheselske |

(Continued)

OTHER PUBLICATIONS

Pending U.S. Appl. No. 12/785,203, Office Action dated Nov. 2, 2010.

(Continued)

*Primary Examiner* — Jerome Jackson, Jr.
(74) *Attorney, Agent, or Firm* — CAO Group, Inc.; Terry S. Jones

(57) ABSTRACT

The present invention is a semiconductor light source 100 for illuminating physical spaces including a lead frame with multiple facets 101. Each facet can have one or more semiconductor light emitting devices 108, such as LEDs, located on it. The light source is disclosed in threaded 100, surface mounted 400, and bar light 700 configurations.

4 Claims, 8 Drawing Sheets

(56) References Cited

U.S. PATENT DOCUMENTS

| | | |
|---|---|---|
| 5,174,646 A | 12/1992 | Siminovitch |
| 5,349,599 A | 9/1994 | Larkins |
| 5,414,281 A | 5/1995 | Watabe |
| 5,463,280 A | 10/1995 | Johnson |
| 5,535,230 A | 7/1996 | Abe |
| 5,575,459 A | 11/1996 | Anderson |
| 5,595,438 A | 1/1997 | Burd |
| 5,655,830 A | 8/1997 | Ruskouski |
| 5,688,042 A | 11/1997 | Madadi |
| 5,707,139 A | 1/1998 | Haitz |
| 5,721,430 A | 2/1998 | Wond |
| 5,758,951 A | 6/1998 | Haitz |
| 5,765,940 A | 6/1998 | Levy |
| 5,803,579 A | 9/1998 | Turnbull |
| 5,806,965 A | 9/1998 | Deese |
| 5,813,752 A | 9/1998 | Singer |
| 5,890,794 A | 4/1999 | Abtahi |
| 5,941,626 A | 8/1999 | Yamuro |
| 5,941,631 A | 8/1999 | Hsu |
| 5,947,588 A | 9/1999 | Huang |
| 5,982,092 A | 11/1999 | Chen |
| 6,015,979 A | 1/2000 | Sugiura |
| 6,045,240 A | 4/2000 | Hochstein |
| 6,149,283 A | 11/2000 | Conway |
| 6,220,722 B1 | 4/2001 | Begemann |
| 6,238,077 B1 | 5/2001 | Ramer |
| 6,355,946 B1 | 3/2002 | Ishinaga |
| 6,357,889 B1 | 3/2002 | Duggal |
| 6,402,338 B1 | 6/2002 | Mitzel |
| 6,412,971 B1 | 7/2002 | Wojnarowski |
| 6,478,453 B2 | 11/2002 | Lammers |
| 6,499,860 B2 | 12/2002 | Begemann |
| 6,502,952 B1 | 1/2003 | Hartley |
| 6,504,180 B1 | 1/2003 | Hermans |
| 6,541,800 B2 | 4/2003 | Barnett |
| 6,561,680 B1 | 5/2003 | Shih |
| 6,577,073 B2 | 6/2003 | Shimizu |
| 6,580,228 B1 | 6/2003 | Chen |
| 6,601,982 B1 | 8/2003 | Begemann et al. |
| 6,635,987 B1 | 10/2003 | Wojnarowski et al. |
| 6,709,132 B2 | 3/2004 | Ishibashi |
| 6,715,900 B2 * | 4/2004 | Zhang ............ 362/294 |
| 6,786,625 B2 | 9/2004 | Wesson |
| 6,815,241 B2 | 11/2004 | Wang |
| 6,840,654 B2 | 1/2005 | Guerrieri |
| 6,903,380 B2 | 6/2005 | Barnett |
| 6,948,829 B2 | 9/2005 | Verdes |
| 6,974,233 B1 | 12/2005 | Aubrey |
| 6,982,518 B2 | 1/2006 | Chou |
| 7,128,454 B2 | 10/2006 | Kim |
| 7,150,553 B2 | 12/2006 | English |
| 7,196,358 B1 | 3/2007 | Chen |
| 7,490,959 B2 | 2/2009 | Tsuda |
| 7,588,351 B2 | 9/2009 | Meyer |
| 7,726,858 B2 | 6/2010 | Sato |
| 2002/0113244 A1 | 8/2002 | Barnett |
| 2003/0031032 A1 | 2/2003 | Wu |
| 2003/0117797 A1 | 6/2003 | Sommers |
| 2004/0095738 A1 | 5/2004 | Juang |
| 2004/0201025 A1 | 10/2004 | Barnett |
| 2004/0264196 A1 | 12/2004 | Shu |
| 2005/0007772 A1 | 1/2005 | Yen |
| 2005/0174780 A1 | 8/2005 | Park |
| 2005/0194607 A1 | 9/2005 | Barnett |
| 2005/0243550 A1 | 11/2005 | Stekelenburg |
| 2005/0254246 A1 | 11/2005 | Huang |
| 2006/0138440 A1 | 6/2006 | Jyo |
| 2006/0232974 A1 | 10/2006 | Lee |
| 2007/0236935 A1 | 10/2007 | Wang |
| 2007/0253202 A1 * | 11/2007 | Wu et al. ............ 362/294 |
| 2008/0105886 A1 | 5/2008 | Borner |
| 2008/0197374 A1 | 8/2008 | Sung |

OTHER PUBLICATIONS

Pending U.S. Appl. No. 11/938,131, Office Action dated Mar. 11, 2010.

Pending U.S. Appl. No. 11/938,131, Office Action dated Nov. 26, 2010.

PCT Application, Serial No. PCT/US2007/065995, Written Opinion of the International Searching Authority, Jun. 20, 2008.

* cited by examiner

SEMICONDUCTOR LIGHT SOURCE FOR ILLUMINATING A PHYSICAL SPACE INCLUDING A 3-DIMENSIONAL LEAD FRAME

CROSS-REFERENCES TO RELATED APPLICATIONS

The present Application is a National Phase entry of PCT/US07/65995, filed on Apr. 4, 2007 as a Continuing-In-Part Application of prior filed U.S. Utility patent application Ser. No. 11/397,323 filed on Apr. 4, 2006. This parent application is a continuation-in-part of U.S. Utility patent application Ser. No. 10/773,123 filed on Feb. 5, 2004, now abandoned, which is a continuation of U.S. patent application Ser. No. 09/938,875 filed on Aug. 24, 2001, now U.S. Pat. No. 6,746,885. Each of those patent applications is hereby incorporated by reference.

TECHNICAL FIELD

The present invention related to the field of electrical illumination and lighting and more particularly relates to a light source utilizing Light Emitting Diodes (LEDs) on a three dimensional internal lead frame to provide illumination.

BACKGROUND ART

This disclosure pertains to light sources, such as light bulbs, for illuminating physical spaces. In particular, the difficulty of generating sufficient light with a light emitting diode (LED) light source to illuminate a physical space is addressed. In the past, LED lights were often restricted to serving as accent lighting due to insufficient light output. There are several ways to increase LED output. One is to increase the size of the chips. Another is to utilize more chips in the light source.

Increasing in chip size creates several issues. First, it increases cost because production processes must be more precise as chip size increases. Second, the chip will have a lower emitting efficiency due to heat issues. When an LED chip is enlarged, heat is also proportionally increased. Large amount of heat are not easily removed from the chip, therefore, the overall temperature of the chip will be increased, and light emitting efficiency will decrease.

In the prior art, multiple LED chips were integrated together on a 2-dimensional plate form to achieve an increase in power. Integration of multiple chips in a two-dimensional array also has disadvantages of a large footprint and a complicated production process.

This disclosure relates to structures and processes for creating an LED light source using a three-dimensional multiple facet lead frame to create a compact and efficient light source.

DISCLOSURE OF THE INVENTION

A three-dimensional multiple-faced lead frame is used to create a compact and efficient light source. To accomplish this and other objectives, the invention comprises a three-dimensional lead frame with a shaft and an electrical connection structure, like a standard screw thread or electrical panel connection. With the threaded structure, the light source can be twisted into a traditional light socket to replace prior art incandescent bulbs. Faces or facets are provided on the lead frame which itself acts as cathode for the LEDs mounted upon it. An anode cap is provided with an extended pin and is isolated from the cathode by an insulation layer. One or more LED chips are placed on selected facets of the lead frame to create a lighting arc which may measure up to 360 degrees. A wire connects the anode of the chip to the anode of the lead frame and wire connects the cathode of the chip to the main body of the lead frame. A plurality of chips may be arranged in an array or some form of modular arrangement where they are all individually connected to a base unit which is then, in turn, connected to the lead frame. The lead frame and chips are covered by an encapsulation structure made from epoxy, silicon, plastic, or similar material which acts as optical lens for light emitted from chip. The structure also acts as a protection layer for the chip and lead frame and, ideally, waterproofs the light source. The overall design achieves the following features for a light source: emission of light in an arc up to and including 360 degrees; the light source is easily replaceable, and the light source is completely sealed and water proof.

It should be noted that Applicant recognizes that all forms with volume are technically three-dimensional; this would conceivably include plates on which two-dimensional arrays of LEDs are mounted. However, for purposes of this application, a "three-dimensional lead frame" is interpreted to mean a lead frame where each surface, excluding the surface on which an anode is mounted, of the lead frame is usable for LED mounting in the practice of the invention, thereby presenting three dimensions of useable surface. Included shapes would be almost any cylindrical (circular or polygonal), hemispherical, spherical, or domed shape. Plates, though technically three-dimensional, would not be included as they only present useful LED mounting surface in two dimensions (even if both sides are used, they are two parallel planes).

These and other features and advantages of the present invention will be set forth or will become more fully apparent in the description that follows and in the appended claims. The features and advantages may be realized and obtained by means of the instruments and combinations particularly pointed out in the appended claims. Furthermore, the features and advantages of the invention may be learned by the practice of the invention or will be obvious from the description, as set forth hereinafter.

Many objects of this invention will appear from the following description and appended claims, reference being made to the accompanying drawings forming a part of this specification wherein like reference characters designate corresponding parts in the several views.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. Also it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BEST MODE FOR CARRYING OUT THE INVENTION

With reference now to the drawings, the preferred embodiment of the application tool is herein described. It should be noted that the articles "a", "an", and "the", as used in this specification, include plural referents unless the content clearly dictates otherwise. Materials cited in this description are also exemplary and all have substitutes known in the art which will perform similarly in the practice of the invention. As such, the description below should be seen as illustrative and not limiting.

Figure 1:
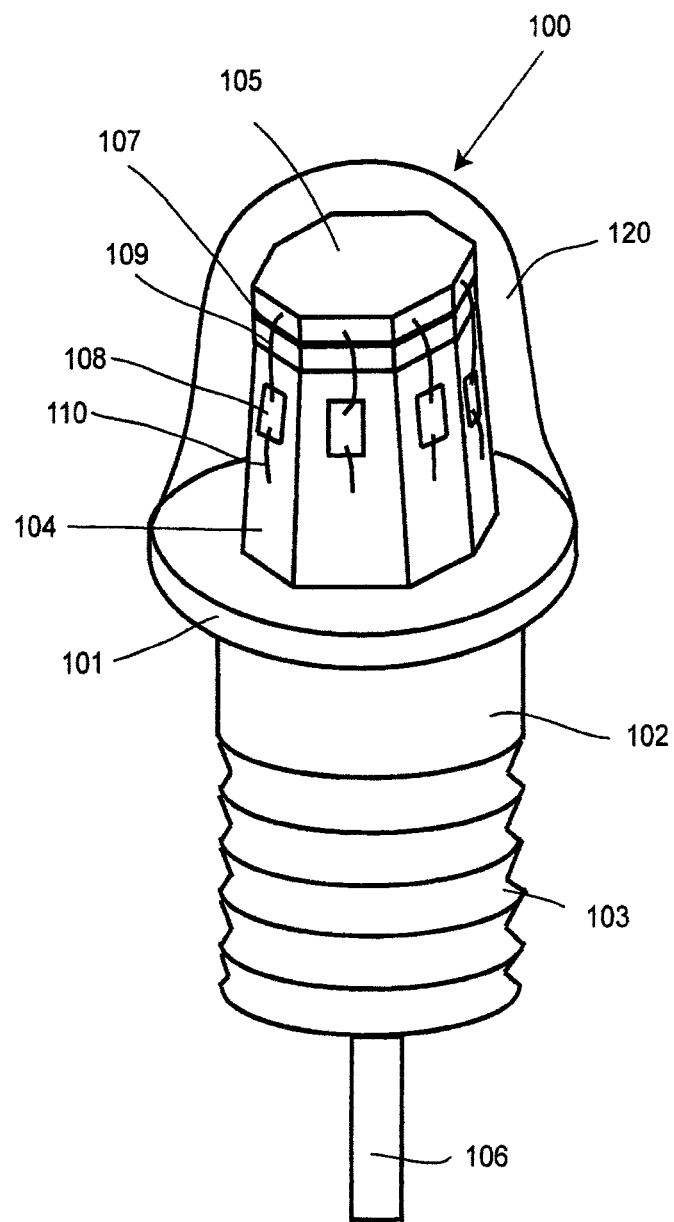
FIG. 1 depicts a perspective view of a light source for illuminating a physical space using a 3-dimensional multiple-faced lead frame.

FIG. 1 depicts a light source 100 having a 3-dimensional lead frame with multiple facets or faces to house multiple LED chips. A 3-dimensional lead frame 101 is provided with a shaft 102 and a standard screw thread 103. With the threaded structure, the light source can be twisted into a traditional light socket to replace prior art incandescent bulbs. Faces or facets 104 are provided on the lead frame 101. The lead frame 101 itself acts as cathode for the light source 100. A cap 105 of the anode is provided with an extended pin 106. The cathode and anode are isolated by an insulation layer 107. The LED chip(s) 108 are placed on each facet of the lead frame 101. One or more chips per facet or face can be used. A wire 109 connects the anode of the chip 108 to the anode 105 of the lead frame and wire connects the cathode of the chip to the main body of the lead frame. The lead frame with chips is covered by an epoxy cap 120. The epoxy cap 120 acts as optical lens for light emitted from chip and also as protection layer for the chip and lead frame. The overall design achieves the following features for a light source: emission of light in an arc of up to and including 360 degrees; the light source is easily replaceable, and the light source is completely sealed and water proof.

Figure 2:
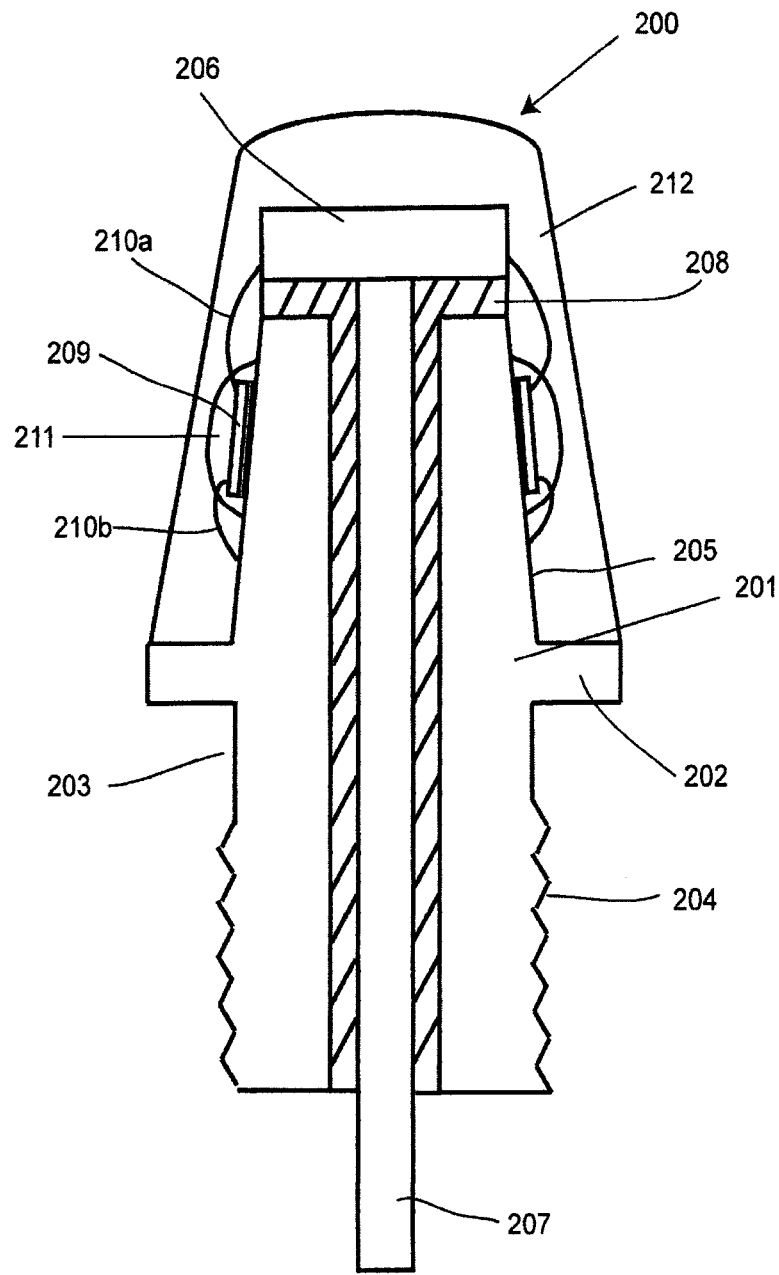
FIG. 2 depicts a cross-sectional view of the device of FIG. 1.
Figure 3:
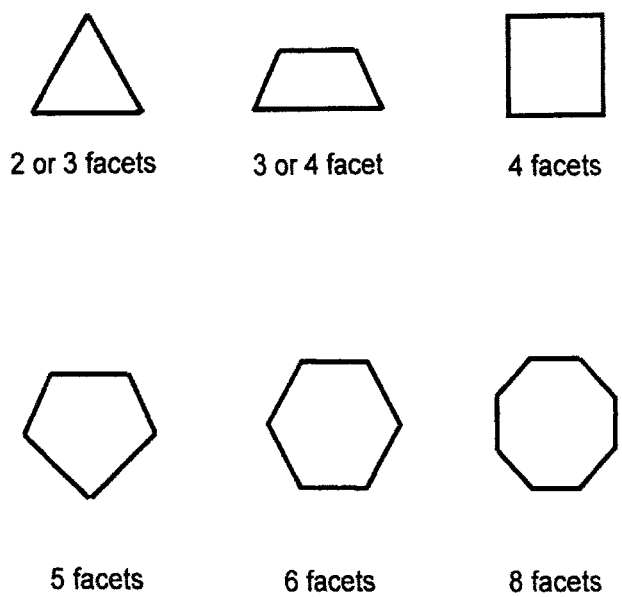
FIG. 3 depicts some example shapes for lead frame.

FIG. 2 depicts cross section 200 of the light source described in FIG. 1. Lead frame 201 is shown in cross section. Base 202 is the cathode of the LED, and the shaft 203 of the cathode connects to a threaded fitting 204. The facet portion 205 of the cathode is almost perpendicular to the base 202 in this example. Based on design requirements, the facet may or may not be perpendicular to the base. Cap 206 of the anode of the lead frame has a pin 207 extending through cathode of lead frame. The anode and cathode are isolated by an insulation material 208. The insulation material can be epoxy, ATO, or any other materials having insulation properties. The insulation layer will electrically insulate the anode and cathode. Chips such as 209 are attached to facets of the lead frame. Chip 209 is connected to anode 206 using wire 210a and is connected to cathode 201 using Au or Al wire 210b. There is a light conversion layer 211 coated on top of chip 209 to convert the emitted from the chip into different color when such conversion is required, it is absent when not so required. The lead frame, anode, cathode, and chips are covered by an epoxy cap 212. The epoxy cap 212 acts as both optical lens and also as a protection layer for lead frame and chips. While not depicted in these Figures, it should be understood that the connection of the LED chips to the lead frame may be either electrically in series or parallel in respect to each other and the LED chips may be assembled in an array structure, as illustrated, or pre-assembled into a module which is then attached to the lead frame anode and cathode. All of these variations are considered embodiments of this invention.

FIGS. 3a-3f depict example profiles for a lead frame. The main shape of the lead frame is defined by the shape of cathode. The anode has the same shape as cathode and both can be any shape as desired.

Figure 4:
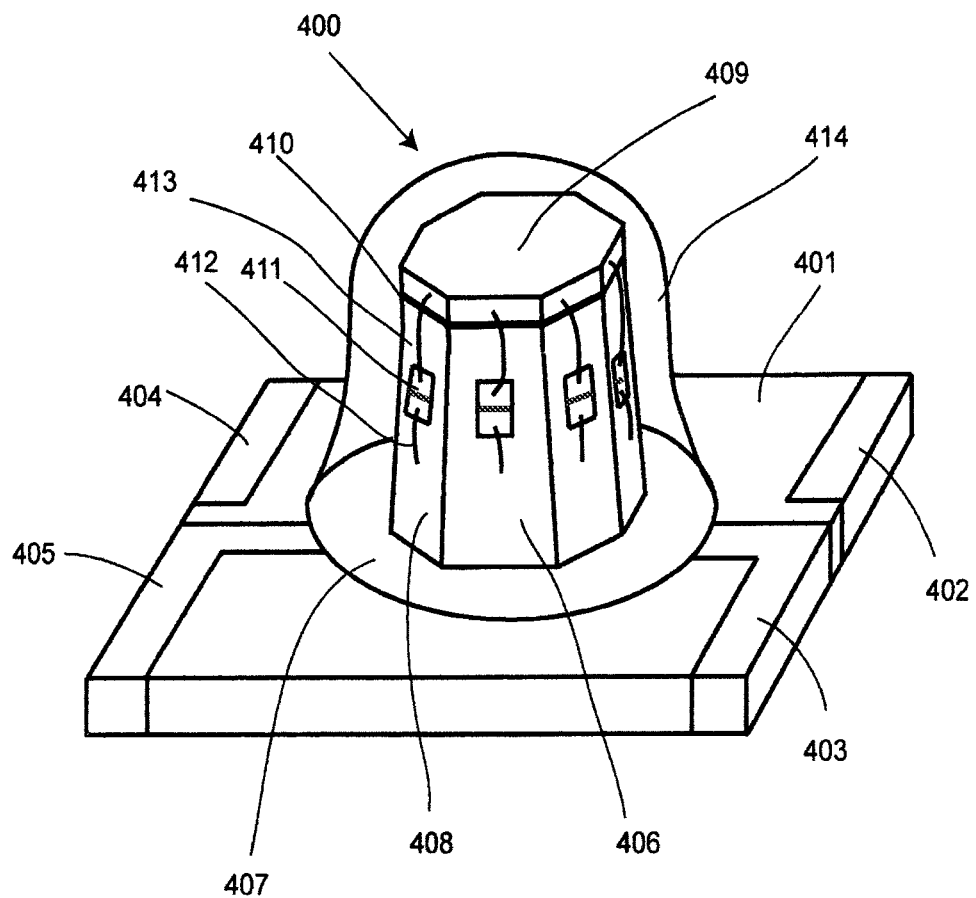
FIG. 4 depicts a perspective view of an alternative light source using a 3-dimensional multiple-faced lead frame.

FIG. 4 depicts a multiple faceted light source with a surface mount type package 400. A base 401 is provided that acts as a heat conductor. It can be made from electrically insulating material, such as ceramics, plastics, etc. On the base 401, electrodes 402 and 403 are laid on one side of the base and electrodes 404 and 405 are laid on the other side the base. Anodes 402 and 404 are also provided to complete the circuit with cathodes 403 and 405. Electrodes may be made by coating a metal layer like Al or Au or other alloys on top of a ceramic base. On top of the 401 base, there sits a cathode 407 of lead frame 406. The cathode 407 of lead frame 406 is connected to base 401. There are multiple vertical facets 408 connected to base 407. The anode cap 409 is placed on top of the cathode lead frame with an insulation layer 410 in between. A chip 411 is laid on one of the facets. The chip 411 is connected to cathode and anode through wires 412 and 413. The lead frame and chips are capped with epoxy layer 414, which will serve as a cap and also as an optical lens. It should be noted that by "surface mounted," this Application means any configuration whereby the light source is mounted upon a flat surface. Various surface mounted configurations exist, including and not limited to placing the light source on a printed circuit board or mounting the light source on an electrical panel. All such configurations where a light source can be mounted upon a flat surface should be considered included in the term.

Figure 5:
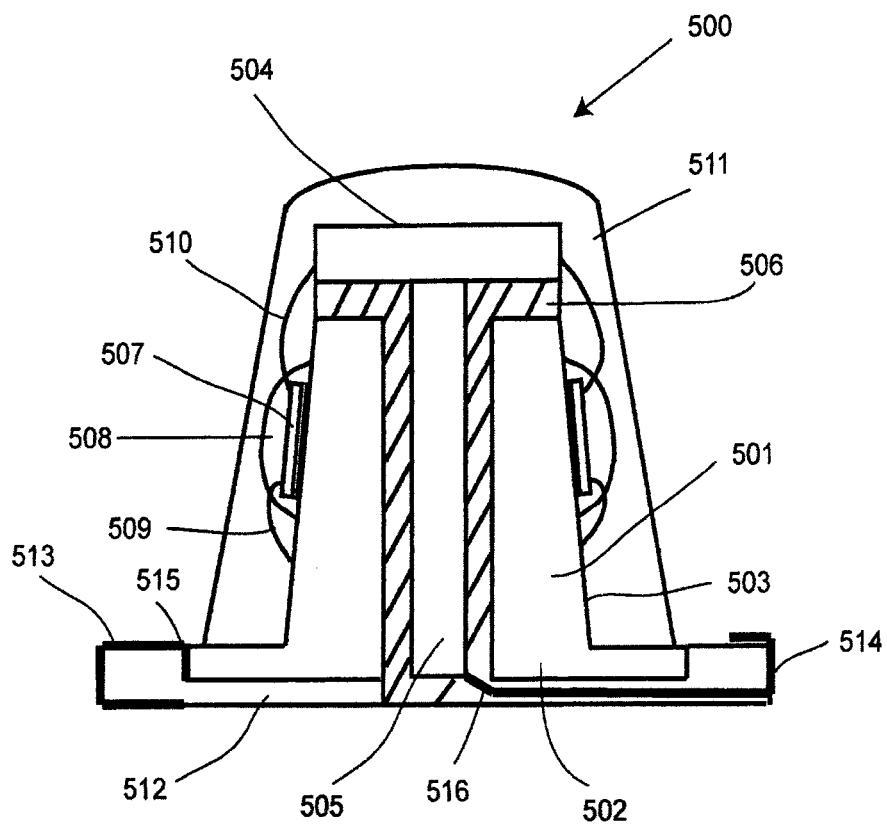
FIG. 5 depicts a cross-sectional view of the device of FIG. 4.

FIG. 5 depicts a cross-sectional view of a light source 500 such as that already discussed with respect to FIG. 4. A lead frame cathode 501 is provided with a base 502. A cap 504 is provided as well as an anode pin 505. An insulation layer 506 is located between the cathode and anode. An LED chip 507 is located on one of the frame faces such as 503. An optional phosphor coating layer 508 may be used for light color conversion. Wires 509 and 510 connect the chip to anode and cathode. An epoxy cap 511 covers the whole lead frame. The base profile of the LED is shown at 512. The material for base 512 has a property for heat conduction and electrical insulation. Electrodes are laid using metal coating layers 513 and 514 for cathode and anode, respectively. The cathode 503 of the lead frame is connected to cathode 513 in the base through connection 515 and anode 505 of the lead frame is connected to anode in the base 514 through connection 516.

Figure 6:
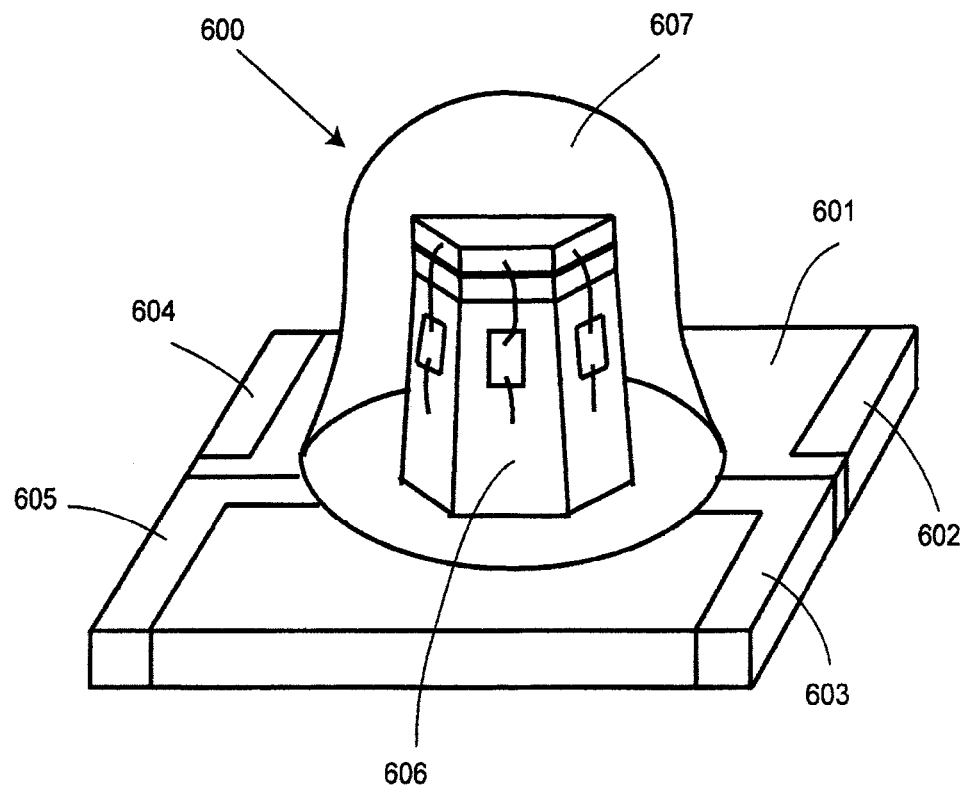
FIG. 6 depicts a perspective view of another alternative light source using a 3-dimensional multiple-faced lead frame.

FIG. 6 depicts another packaging style with light only emitted in one direction, that is to say having a lighting arc of less than 360 degrees. Note the fewer facets on the frame. The LED 600 has a base 601 and electrodes 602, 603, 604, and 605 respectively. The lead frame 606 only has multiple facets in one direction and chips are placed on these facets. One facet, facing a direction not desired to be illuminated, is not used in this configuration. However, depending on the shape of the lead frame, any number of facets may not have LED chips mounted upon them to limit the lighting arc to less than 360 degrees. There is an epoxy cap 607 to protect the lead frame and LED chips. The light will be emitted in one direction. Such light can be used for different backlighting applications.

Figure 7:
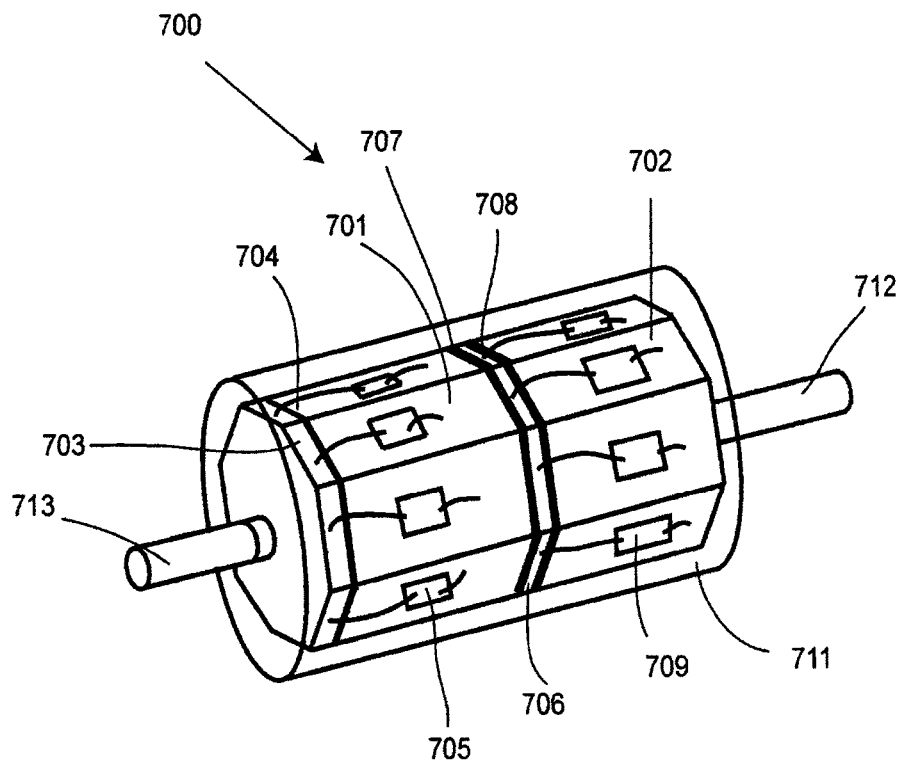
FIG. 7 depicts a perspective view of another alternative light source using a 3-dimensional multiple-faced lead frame.

FIG. 7 depicts a cylinder, or bar, style light source comprised of two multiple face lead frames connected to each other. Light source 700 has two cathode lead frames 701 and 702 with multiple facets. One anode 703 is placed to next to cathode 701 with insulation layer 704. A chip 705 is placed on one of facets with wire connections to anode and cathode. Another anode 706 which is sandwiched by two insulation layers 708 and 709 is placed between frames 701 and 702. LED chip 709 is placed on top of one of faces in 702. An epoxy cap 711 is molded to cover the whole lead frame and components. Electrodes 712 and 713 are set up as the leads for anode and cathode, respectively.

Figure 8:
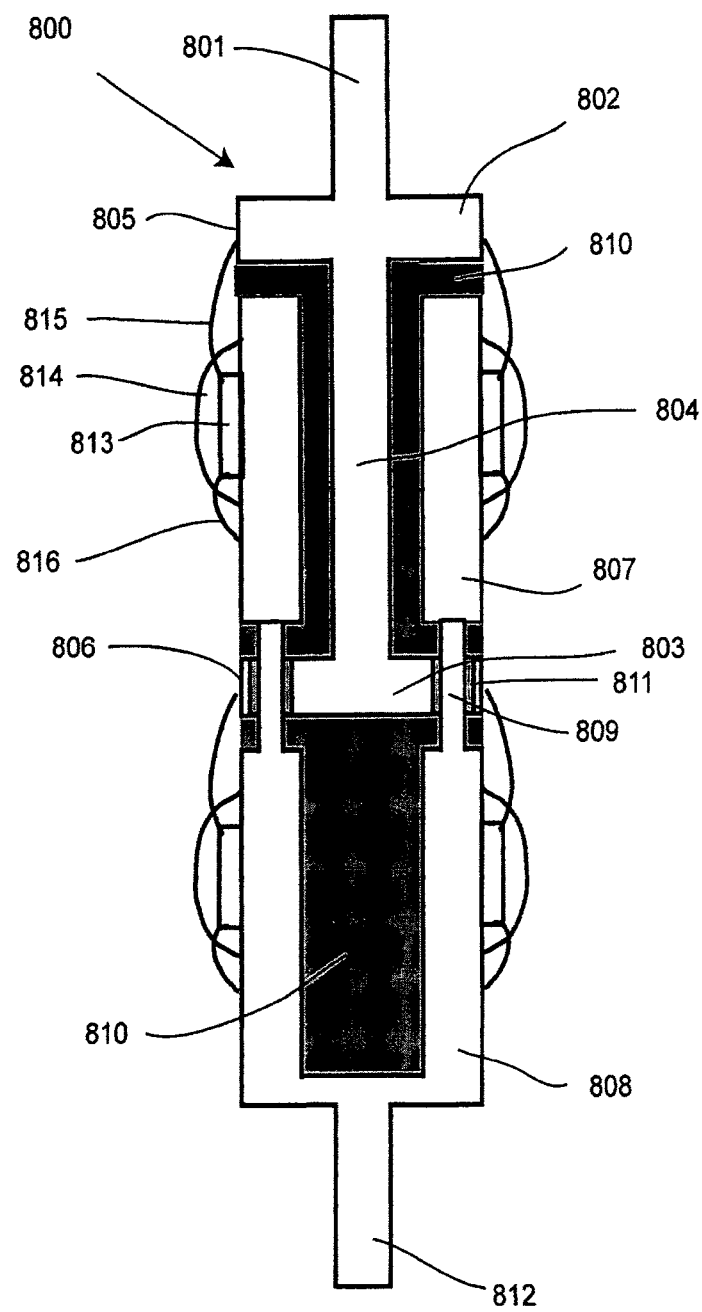
FIG. 8 depicts a cross-sectional view of the device of FIG. 7.

FIG. 8 depicts a cross sectional view of the LED illustrated in FIG. 7. This view shows the arrangement between anode and cathode. In the anode, there is a contact 801. Platforms 802 and 803 are connected by a rod 804. There are two bonding facets 805 and 806 on platforms 802 and 803, respectively. Two cathodes 807 and 808 with multiple facets are connected through connection rod 809. Insulation layers 810 and 811 are used to fill the space between anode and cathode. The contact for cathode is 812. A chip 813 is mounted on a facet of the lead frame. An optional phosphor coating 814 can provide wavelength conversion. Wires 815 and 816 connect the chip to the anode and cathode. It should be noted that the structure and assembly illustrated above may also be used to make longer bar light sources by incorporating three, four, five, or more lead frames in the structure. Likewise, the frames may be unidirectional as described earlier in this specification.

A light source with a multiple faceted lead frame with LED chip(s) attached to each facet can therefore be provided to integrate multiple chip(s) into one small foot print package. The number of facets on the lead frame can be I to infinity depending on requirements. The lead frame is a 3-dimensional device with facets angled in desired directions. Cathode and anode of the lead frame are isolated with insulation materials. One or more LED chips can be attached to each facet. A light conversion layer may be coated on top of LED chips to convert the color of the light emitted by the chips. The lead frame is covered by a capsule made of epoxy or similar material as both protection and optical lens. The lead frame can be a diode type with a thread on the base or surface mount type with electrodes on the base. The multiple faceted lead frame can be one section or multiple sections to form a bar type of light source. A white light source with multiple facet lead frame is made by applying a phosphor on top of a blue chip. The lead frame is made from a heat conducting material in order to draw heat away from the chips and avoid loss of lumen output due to heat effect.

While the present invention has been described and illustrated in conjunction with a number of specific embodiments, those skilled in the art will appreciate that variations and modifications may be made without departing from the principles of the invention as herein illustrated, described, and claimed. The present invention may be embodied in other specific forms without departing from its spirit or essential characteristics. The described embodiments are to be considered in all respects as only illustrative, and not restrictive. All changes which come within the meaning and range of equivalency of the claims are to be embraced within their scope. No limitation with respect to the specific embodiments disclosed herein is intended or should be inferred.

INDUSTRIAL APPLICABILITY

The present invention utilizes solid state technology and improved geometry to provide compact and efficient lighting sources. The techniques in manufacture are similar to the techniques used in present day manufacturing of similar lighting sources except that a multi-faceted lead frame is constructed for mounting LEDs. As such, more LEDs may be mounted in a smaller volume than with prior art devices; thus, providing more illumination.

I claim:

1. A semiconductor light source for illuminating a physical space comprising a lead frame having at least two electrodes, one being a cathode and another being an anode, the lead frame further comprising:
   a. a cylindrical electrode, made of a heat conductive material, having a closed first end upon which an electrical connection is attached,
   b. a second electrode, insertable within the cylindrical electrode, said second electrode having an upper portion with a diameter sufficient to prevent full insertion into the cylindrical electrode and an electrical connection;
   c. electrical insulation between the cylindrical electrode and said second electrode, thereby electrically isolating said cylindrical electrode from said second electrode;
   d. a plurality of facets located on said cylindrical electrode, said facets being configured to accept mounting of light emitting semiconductor chips thereon; and
   e. a plurality of light emitting semiconductor chips mounted on said facets of said cylindrical electrode and connected electrically to said cylindrical electrode and said second electrode.

2. A semi-conductor light source as recited in claim 1 wherein said cylindrical electrode and said second electrode are configured with respect to each other to form a bar light.

3. A semi-conductor light source as recited in claim 2 further comprising an encapsulation structure over said bar light.

4. A semi-conductor light source as recited in claim 1 further comprising at least one other lead frame with a plurality of facets in operable connection to the lead frame and having at least one LED chip on at least one facet.

* * * * *